United States Patent
Koike et al.

(10) Patent No.: US 6,860,943 B2
(45) Date of Patent: Mar. 1, 2005

(54) METHOD FOR PRODUCING GROUP III NITRIDE COMPOUND SEMICONDUCTOR

(75) Inventors: Masayoshi Koike, Aichi-ken (JP); Hiroshi Watanabe, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 139 days.

(21) Appl. No.: 10/268,998

(22) Filed: Oct. 11, 2002

(65) Prior Publication Data

US 2003/0070607 A1 Apr. 17, 2003

(30) Foreign Application Priority Data

Oct. 12, 2001 (JP) ........................................ 2001-315955

(51) Int. Cl.$^7$ .................... C30B 25/02; C30B 25/04; C30B 25/14
(52) U.S. Cl. ................ 117/102; 117/89; 117/93; 117/97; 117/105; 117/108
(58) Field of Search .......................... 117/84, 89, 93, 117/97, 102, 105, 108

(56) References Cited

U.S. PATENT DOCUMENTS

| | | | |
|---|---|---|---|
| 5,185,290 A | 2/1993 | Aoyagi et al. | |
| 5,798,536 A | 8/1998 | Tsutsui | |
| 6,051,849 A | 4/2000 | Davis et al. | |
| 6,110,277 A | 8/2000 | Braun | |
| 6,121,121 A | 9/2000 | Koide | |
| 6,146,457 A | 11/2000 | Solomon | |
| 6,153,010 A | 11/2000 | Kiyoku et al. | |
| 6,274,518 B1 | 8/2001 | Yuri et al. | |
| 6,319,742 B1 | 11/2001 | Hayashi et al. | |
| 6,329,667 B1 | 12/2001 | Ota et al. | |
| 6,355,497 B1 | 3/2002 | Romano et al. | |
| 6,365,921 B1 | 4/2002 | Watanabe et al. | |
| 6,380,108 B1 * | 4/2002 | Linthicum et al. | 438/791 |

FOREIGN PATENT DOCUMENTS

| | | |
|---|---|---|
| EP | 0 551 721 A2 | 7/1993 |
| EP | 0 779 666 A3 | 6/1997 |
| EP | 0 951 055 A2 | 10/1999 |
| EP | 0 993 048 A2 | 4/2000 |
| EP | 1 045 431 A1 | 10/2000 |

(List continued on next page.)

OTHER PUBLICATIONS

PCT Forms 338 and 409 (IPER) (PCT/JP02/05446) and translations thereof.
PCT Forms 338 and 409 (IPER) (PCT/JP02/02628) and translations thereof.

(List continued on next page.)

Primary Examiner—Felisa Hiteshew
(74) Attorney, Agent, or Firm—McGinn & Gibb, PLLC (57) ABSTRACT

Disclosed is a method for producing a Group III nitride compound semiconductor including a pit formation step in which a portion of an uppermost layer of a first Group III nitride compound semiconductor layer containing one or more sub-layers, the portion containing lattice defects, is subjected to treatment by use of a solution or vapor which corrodes the portion more easily than it corrodes a portion of the uppermost layer containing no lattice defects, the first Group III nitride compound semiconductor layer not being accompanied by a substrate therefor as a result of removal therefrom, or being accompanied by a substrate such that the semiconductor layer is formed with or without intervention of a buffer layer provided on the substrate; and a lateral growth step of growing a second Group III nitride compound semiconductor layer through vertical and lateral epitaxial overgrowth around nuclei as seeds for crystal growth which are on flat portions of the uppermost layer of the first Group III nitride compound semiconductor layer, but not on portions of the uppermost layer that define pits formed through the pit formation step.

24 Claims, 3 Drawing Sheets

FOREIGN PATENT DOCUMENTS

| | | |
|---|---|---|
| EP | 1 059 661 A2 | 12/2000 |
| EP | 1 059 677 A2 | 12/2000 |
| JP | 49-149679 | 4/1973 |
| JP | 48-95181 | 12/1973 |
| JP | 51-137393 | 11/1976 |
| JP | 55-34646 | 8/1978 |
| JP | 57-115849 | 7/1982 |
| JP | 58-33882 | 2/1983 |
| JP | 1-316459 | 12/1989 |
| JP | 3-133182 | 6/1991 |
| JP | 4-10665 | 1/1992 |
| JP | 4-84418 | 3/1992 |
| JP | 4-303920 | 10/1992 |
| JP | 05-041536 | 2/1993 |
| JP | 5-110206 | 4/1993 |
| JP | 5-283744 | 10/1993 |
| JP | 05-343741 | 12/1993 |
| JP | 6-196757 | 7/1994 |
| JP | 7-249830 | 9/1995 |
| JP | 07-273367 | 10/1995 |
| JP | 08-064791 | 3/1996 |
| JP | 8-102549 | 4/1996 |
| JP | 8-116090 | 5/1996 |
| JP | 8-222812 | 8/1996 |
| JP | 8-274411 | 10/1996 |
| JP | 9-162125 | 6/1997 |
| JP | 10-312971 | 11/1998 |
| JP | 10-321954 | 12/1998 |
| JP | 11-31864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-330546 | 11/1999 |
| JP | 2000-21789 | 1/2000 |
| JP | 2000-44121 | 2/2000 |
| JP | 2000-91253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-60719 | 3/2001 |
| JP | 2001-93837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO97/11518 | 3/1997 |
| WO | PCT WO 98/47170 | 10/1998 |
| WO | PCT WO 99/01594 | 1/1999 |
| WO | PCT WO 00/04615 | 1/2000 |
| WO | PCT WO 00/55893 | 9/2000 |
| WO | PCT WO 02/058120 A1 | 7/2002 |

OTHER PUBLICATIONS

PCT Forms 338 and 409 (IPER) (PCT/JP02/01159) and translations thereof.
Hidetada Matsushima et al., "Selective growth of GaN on sub–micron pattern by MOVPE", Technical Report of IEICE, pp. 41–46.
Yoshinori Ujiie et al., "Epitaxial Lateral Overgrowth of GaAs on a Si Substrate", Japanese Journal of Applied Physics, vol. 28, No. 3, Mar., 1989, pp. L337–L339.
Partial Translation of Japanese Patent Application No. 9–311518 dated Jun. 10, 2003.
D. Kapolnek et al., "Anisotropic epitaxial lateral growth in GaN selective area epitaxy", Appl. Phys. Lett. 71 (9), Sep. 1, 1997, pp. 1204–1206.
Wolf et al., "Silicon Processing for the VLSI Era," vol. 1, p. 5, Lattice Press, 1986.
Translation of PCT Forms 338 and 409 (PCT/JP01/01928).
Translation of PCT Forms 338 and 409 (PCT/JP01/01396).
Nam et al., "Lateral epitaxy of low defect density GaN layers via organometallic vapor phase epitaxy", pp. 2638–2640, Appl. Phys. Lett. 71 (18), Nov. 3, 1997.
Hiramatsu et al., "Selective area growth and epitaxial lateral overgrowth of GaN by metalorganic vapor phase epitaxy and hydride vapor phase epitaxy", pp. 104–111, Materials Science and Engineering B59 (1999).
Akasaki et al., "Effects of AlN Buffer Layer on Crystallographic Structure and on Electrical and Optical Properties of GaN and Ga1–xA1xN . . . Movpe" pp. 209–219, Journal of Crystal Growth 98 (1989) North–Holland, Amsterdam.
Yang et al., "High quality GaN–InGaN heterostructures grown on (III) silicon substrates", pp. 3566–3568, Appl. Phys. Lett. 69 (23), Dec. 2, 1996.
Wolf et al., for the VLSI Era, vol. 1—Process Technology, p. 5, "Silicon: Single Crystal Growth and Wafer Preparation."
Luther et al., "Titanium and titanium nitride contacts to n–type gallium nitride", Semicond. Sci. Technol. 13 (1998) pp. 1322–1327.
Dimitriadis et al., "Contacts of titanium nitride to—and p–type gallium nitride films", Solid–State Electronics 43 (1999), pp. 1969–1972.
Zheleva et al., "Pendeo–Epitaxy–A New Approach for Lateral Growth of Gallium Nitride Structures", MRS Internet J. *Nitride Semicond. Res. 4SI, G3.38* (1999), 6 pages total.
Uchida et al., "AlGaInN based Laser Diodes", In–Plans Semiconductor Lasers IV, III–Vs Review vol. 13, No. 3, May/Jun. 2000, pp. 156–164.
Zheleva et al., Pendeo–Epitaxy versus Lateral Epitaxial Overgrowth of GaN: A Comparative Study via Finite element Analysis, Journal of electronic Materials, vol. 28, No. 4, Apr. 1999, pp. 545–551.
Zheleva et al., "Pendeo–Epitaxy: A New Approach for Lateral Growth of Gallium Nitride Films", Journal of Electronic Materials, vol. 28, No. 4, 1999, pp. L5–L8.

\* cited by examiner

METHOD FOR PRODUCING GROUP III NITRIDE COMPOUND SEMICONDUCTOR

The present application claims the Convention priority from Japanese Patent Application No. 2001-315955, the complete disclosures of which are hereby incorporated herein by reference.

BACKGROUND OF THE INVENTION

1. Field of the Invention

The present invention relates to a method for producing a Group III nitride compound semiconductor. More particularly, the invention relates to a method for producing a Group III nitride compound semiconductor through lateral epitaxial overgrowth (LEO). As used herein, the term "Group III nitride compound semiconductor" refers to a semiconductor represented by the following formula: $Al_xGa_yIn_{1-x-y}N$ ($0 \leq x \leq 1$, $0 \leq y \leq 1$, $0 \leq x+y \leq 1$), and encompasses two-component semiconductors such as AlN, GaN, and InN; three-component semiconductors such as $Al_xGa_{1-x}N$, $Al_xIn_{1-x}N$, and $Ga_xIn_{1-x}N$ (in each case, $0<x<1$); and four-component semiconductors represented by the following formula: $Al_xGa_yIn_{1-x-y}N$ ($0<x<1$, $0<y<1$, $0<x+y<1$). Unless otherwise specified, in the present specification, the term "Group III nitride compound semiconductor" also encompasses Group III nitride compound semiconductors which are doped with an impurity for determining a conduction type of p or n.

2. Background Art

Group III nitride compound semiconductors are direct transition semiconductor, and a light-emitting element formed from a Group III nitride compound semiconductor emits light having a wavelength ranging from ultraviolet to red. Therefore, Group III nitride compound semiconductors have been employed for producing light-emitting elements such as a light-emitting diode (LED) and a laser diode (LD). Since a Group III nitride compound semiconductor has a large band gap, an element produced from the semiconductor is considered to be operated reliably at high temperature, as compared with an element produced from a semiconductor other than a Group III nitride compound semiconductor. Therefore, applications of Group III nitride compound semiconductors to a variety of transistors, including an FET, have been developed. Since arsenic (As) is not contained in Group III nitride compound semiconductors as a major component thereof, from the environmental viewpoint, use of the semiconductors in a variety of semiconductor elements is envisaged. In general, a Group III nitride compound semiconductor is formed on a sapphire substrate.

However, when a Group III nitride compound semiconductor is formed on a sapphire substrate, misfit dislocations are generated due to the difference in lattice constant between sapphire and the Group III nitride compound semiconductor, thereby deteriorating properties of the resultant semiconductor element. Such misfit dislocations thread through semiconductor layers in a direction perpendicular to the substrate, and the dislocations ($10^5$ to $10^{10}$ dislocations per $cm^2$) propagate throughout the Group III nitride compound semiconductor. The dislocations propagate through Group III nitride compound semiconductor layers of different compositions to the uppermost layer. When light-emitting elements such as an LD or an LED are produced from the Group III nitride compound semiconductor, because of propagation of the dislocations, properties of the element (e.g., threshold current of LD, service life of LD, or service life of LED) are impaired.

Meanwhile, when semiconductor elements other than light-emitting elements are produced from the Group III nitride compound semiconductor, scattering of electrons caused by the dislocations (i.e., crystal defects) imparts low mobility to the resultant semiconductor element. Such problems arise even when the Group III nitride compound semiconductor is formed on another type of substrate.

Figure 3:
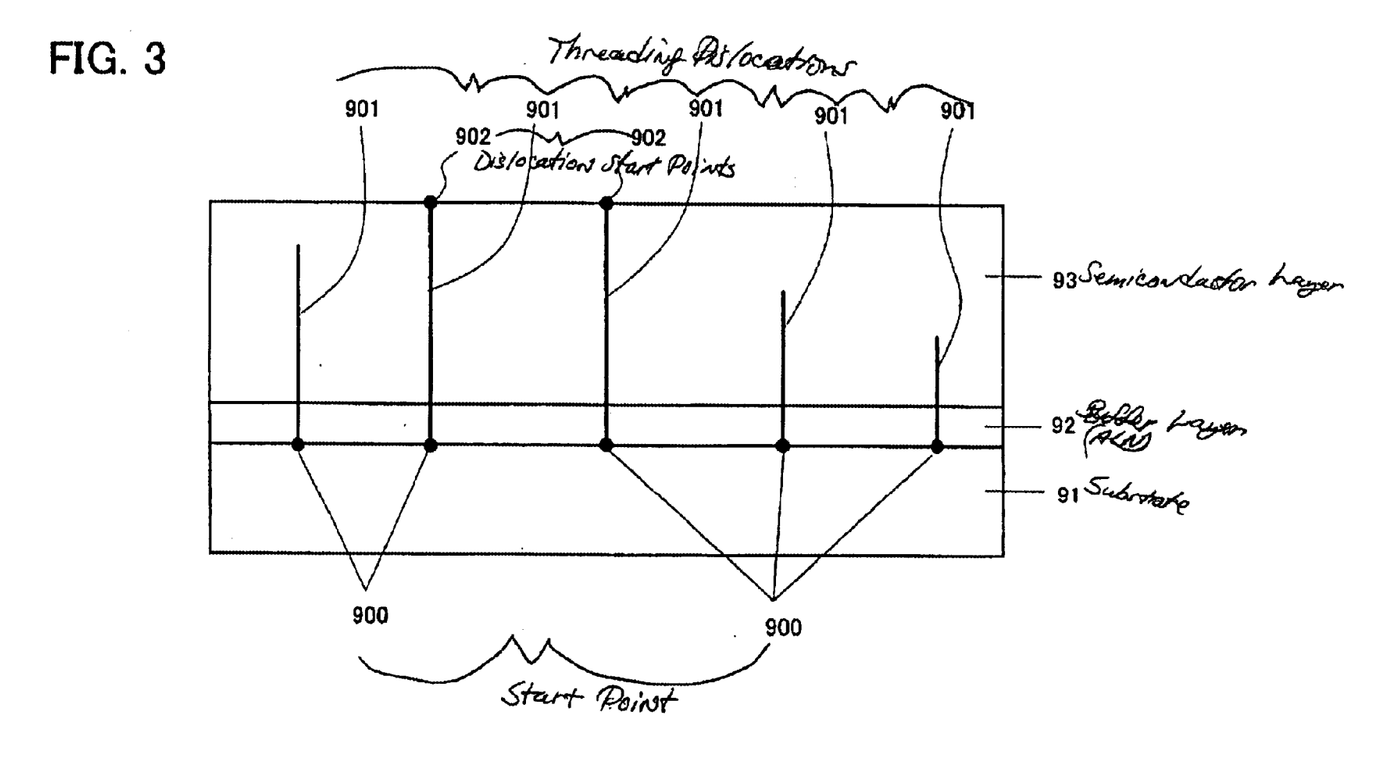
FIG. 3 is a cross-sectional view for depicting threading dislocations which propagate through a Group III nitride compound semiconductor.

Generation of dislocations will be described with reference to a schematic representation shown in FIG. 3. FIG. 3 shows a substrate 91, a buffer layer 92 formed on the substrate 91, and a Group III nitride compound semiconductor layer 93 formed on the buffer layer 92. Conventionally, the substrate 91 has been formed from, for example, sapphire; and the buffer layer 92 has been formed from, for example, aluminum nitride (AlN). The aluminum nitride (AlN) buffer layer 92 is provided for mitigating misfit between the sapphire substrate 91 and the Group III nitride compound semiconductor layer 93. However, even when the buffer layer 92 is provided, generation of dislocations cannot be completely prevented. Threading dislocations 901 propagate in a vertical direction (i.e., a direction perpendicular to the substrate) from dislocation start points 900, and the dislocations 901 thread through the buffer layer 92 and the Group III nitride compound semiconductor layer 93. When a desired Group III nitride compound semiconductor is laminated on the upper surface of the Group III nitride compound semiconductor layer 93, to thereby form a semiconductor element, threading dislocations propagate in a vertical direction from dislocation start points 902 on the upper surface of the Group III nitride compound semiconductor layer 93 through the resultant semiconductor element. Thus, through conventional techniques, propagation of dislocations cannot be prevented during formation of a Group III nitride compound semiconductor layer.

SUMMARY OF THE INVENTION

In view of the foregoing, an object of the present invention is to provide a method for producing a Group III nitride compound semiconductor while suppressing generation of threading dislocations.

Accordingly, the present invention provides a method for producing a Group III nitride compound semiconductor comprising a pit formation step in which a portion of an uppermost layer of a first Group III nitride compound semiconductor layer containing one or more sub-layers, the portion containing lattice defects, is subjected to treatment by use of a solution or vapor which corrodes the portion more easily than it corrodes a portion of the uppermost layer containing no lattice defects, the first Group III nitride compound semiconductor layer not being accompanied by a substrate therefor as a result of removal therefrom, or being accompanied by a substrate such that the semiconductor layer is formed with or without intervention of a buffer layer provided on the substrate; and a lateral growth step of growing a second Group III nitride compound semiconductor layer through vertical and lateral epitaxial overgrowth around nuclei as seeds for crystal growth which are on flat portions of the uppermost layer of the first Group III nitride compound semiconductor layer, but not on portions of the uppermost layer that define pits formed through the pit formation step.

Preferably, the first Group III nitride compound semiconductor layer being accompanied by a substrate such that the semiconductor layer is formed with or without intervention of a buffer layer provided on the substrate is subjected to treatment in the pit formation step, and the substrate is removed after the lateral growth step, to thereby produce a Group III nitride compound semiconductor product having the second Group III nitride compound semiconductor layer on at least the uppermost layer of the product.

The present invention also provides a method for producing a Group III nitride compound semiconductor comprising a first layer formation step of forming a first Group III nitride compound semiconductor layer containing one or more sub-layers above a substrate which can be corroded by a high-temperature vapor, with or without intervention of a buffer layer; a step of removing the substrate through corrosion by use of a high-temperature vapor; a vapor-phase pit formation step in which a portion of an uppermost layer of the first Group III nitride compound semiconductor layer not being accompanied by the substrate, the portion containing lattice defects, is subjected to treatment by use of a vapor that corrodes the portion more easily than it corrodes a portion of the uppermost layer containing no lattice defects; and a lateral growth step for growing a second Group III nitride compound semiconductor layer through vertical and lateral epitaxial overgrowth around nuclei as seeds for crystal growth which are on flat portions of the uppermost layer of the first Group III nitride compound semiconductor layer, but not on portions of the uppermost layer that define pits formed through the vapor-phase pit formation step. As used herein, the term "high-temperature vapor" refers to a gas or gas mixture containing a chemical substance capable of corroding the substrate.

Preferably, the lateral growth step is carried out under conditions such that the second Group III nitride compound semiconductor layer is grown through vertical and lateral epitaxial overgrowth around nuclei as seeds for crystal growth which are on flat portions of the uppermost layer of the first Group III nitride compound semiconductor layer covers the pits faster than the second Group III nitride compound semiconductor layer grows from walls which define pits formed in the uppermost layer through the pit formation step.

Preferably, at least the uppermost layer of the first Group III nitride compound semiconductor layer has the same composition as the second Group III nitride compound semiconductor layer. Preferably, the pits formed in the pit formation step or the vapor-phase pit formation step have a depth of 1 to 20 μm.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

In general, in the case where a first Group III nitride compound semiconductor layer is epitaxially grown on a substrate produced from a dissimilar material other than Group III nitride compound semiconductors (hereinafter such a substrate may be referred to as a "dissimilar substrate" or a "hetero-substrate"), even when a buffer layer is provided between the semiconductor layer and the substrate, numerous threading dislocations are generated. Meanwhile, even in the case where a first Group III nitride compound semiconductor layer is epitaxially grown on a substrate produced from a Group III nitride compound semiconductor (e.g., a GaN substrate)—such a substrate has been developed recently—(hereinafter this substrate may be referred to as a "similar substrate"), when the similar substrate contains threading dislocations, the dislocations propagate through the semiconductor layer grown on the substrate. When the threading dislocations reach the surface of the uppermost layer of the semiconductor layer, the dislocations become lattice defects of the uppermost layer. As is well known, a portion of the uppermost layer of the first Group III nitride compound semiconductor layer, the portion containing lattice defects, can be corroded by, for example, a heated KOH solution or HCl vapor faster than can a portion of the uppermost layer containing no lattice defects. Therefore, when the portion of the uppermost layer containing lattice defects is subjected to treatment by use of a solution or vapor that can corrode the portion more easily than it can corrode the portion of the uppermost layer containing no lattice defects, pits having the shape of an inverted hexagonal cone and having center axes coinciding with threading dislocation lines are formed. The vertexes of the pits correspond to the end points of the threading dislocations. After the pits are formed as described above, when a second Group III nitride compound semiconductor layer is grown through vertical and lateral epitaxial overgrowth around nuclei as seeds for crystal growth which are on flat portions of the uppermost layer of the first Group III nitride compound semiconductor layer, but not on portions of the uppermost layer that define the pits formed in the uppermost layer, the second Group III nitride compound semiconductor layer can be formed such that none of the threading dislocations propagates therethrough. That is, the threading dislocations contained in the second Group III nitride compound semiconductor layer can be reduced in number as compared with those contained in the first Group III nitride compound semiconductor layer. Thereafter, when the substrate is removed, a Group III nitride compound semiconductor product containing small amounts of threading dislocations in its uppermost layer can be produced.

When the substrate can be removed in a vapor phase before formation of the pits, and the pits can be formed in a vapor phase, a process including formation of the first Group III nitride compound semiconductor layer and lateral growth of the second Group III nitride compound semiconductor layer can be carried out at high temperature. In this case, since there is no longer a need to consider generation of cracks attributed to the difference in thermal expansion coefficient between the substrate and the first and second Group III nitride compound semiconductor layers, a process for producing a Group III nitride compound semiconductor product can be simplified, and cracks are not generated in the semiconductor product when the product is cooled to, for example, room temperature.

When the lateral growth step is carried out under conditions such that the second Group III nitride compound semiconductor layer grown through vertical and lateral epitaxial overgrowth around nuclei, which are on flat portions of the uppermost layer of the first Group III nitride compound semiconductor layer, covers the pits faster than the second Group III nitride compound semiconductor grows from walls which define pits formed in the uppermost layer through the pit formation step, propagation of threading dislocations from the first Group III nitride compound semiconductor layer to the second Group III nitride compound semiconductor layer can be prevented appropriately. When at least the uppermost layer of the first Group III nitride compound semiconductor layer has the same composition as the second Group III nitride compound semiconductor layer, lateral growth of the second semiconductor layer can be carried out easily. The depth of the pits is preferably 1 to 20 $\mu$m. When the depth of the pits is less than 1 $\mu$m, effects of the present invention are obtained insufficiently, whereas when the depth of the pits exceeds 20 $\mu$m, the first Group III nitride compound semiconductor layer may fail to have flat portions after formation of the pits.

FIG. 1 is a schematic representation showing an embodiment of the method for producing a Group III nitride compound semiconductor of the present invention. A buffer layer 2 and a first Group III nitride compound semiconductor layer 3 are successively formed on a substrate 1. The first Group III nitride compound semiconductor layer 3 contains threading dislocations 101 and 102. The threading dislocations 102 propagate to the upper surface of the first Group III nitride compound semiconductor layer 3 (see FIG. 1A). Subsequently, pits are formed under conditions such that portions of the semiconductor layer 3 containing lattice defects are corroded faster than are portions of the semiconductor layer 3 containing no lattice defects. As a result, the threading dislocations 102 (i.e., lattice defects) which have propagated to the upper surface of the first Group III nitride compound semiconductor layer 3 are corroded easily, to thereby form pits P (see FIG. 1B).

Thereafter, a second Group III nitride compound semiconductor layer 4 is grown through vertical and lateral epitaxial overgrowth around nuclei as seeds for crystal growth which are provided on flat portions of the first Group III nitride compound semiconductor layer 3, but not on portions of the layer 3 that define the pits P. In this case, very small amounts of threading dislocations propagate from the pits P of the first Group III nitride compound semiconductor layer 3 to the second Group III nitride compound semiconductor layer 4. That is, the threading dislocations which propagate through the second Group III nitride compound semiconductor layer 4 are reduced in number as compared with the pits P of the first Group III nitride compound semiconductor layer 3, and threading dislocation density is considerably lowered (see FIG. 1C). When a semiconductor element is formed on the second Group III nitride compound semiconductor layer 4 provided on a laminate including the substrate 1, the buffer layer 2, and the first Group III nitride compound semiconductor layer 3, the resultant element tends not to suffer impairment caused by threading dislocations. Therefore, the method of the present invention enables provision of a Group III nitride compound semiconductor which is very useful in the manufacture of Group III nitride compound semiconductor elements. In the present invention, whether or not the pits P are filled with the second Group III nitride compound semiconductor layer 4 is of no consequence. When none of the pits P are filled with the semiconductor layer 4, no threading dislocation propagates through the semiconductor layer 4. Even in the case where some of the pits P are filled with the semiconductor layer 4, effects of the present invention may still be obtained, so long as threading dislocations whose end points correspond to the vertexes of the pits P vanish when the pits P are filled with the semiconductor layer 4.

Figure 1A:
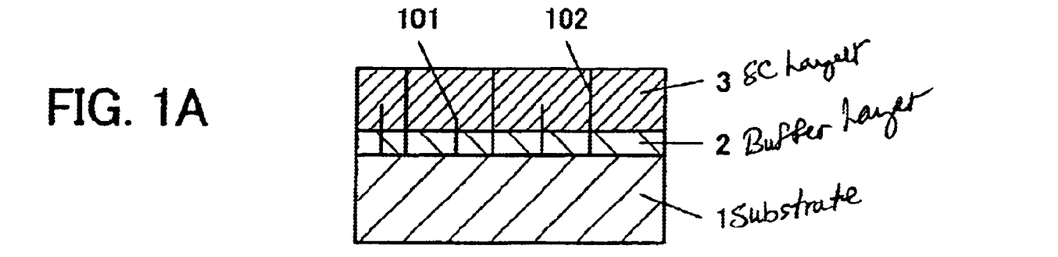
FIGS. 1A to 1E are cross-sectional views showing steps of a method for producing a Group III nitride compound semiconductor according to a first embodiment of the present invention.
Figure 1B:
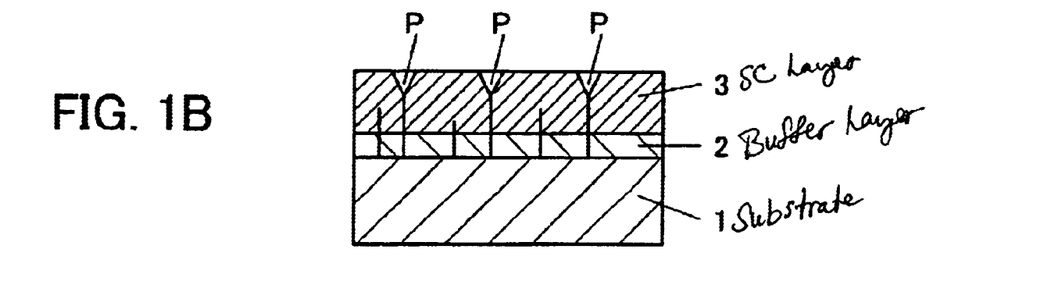
Figure 1C:
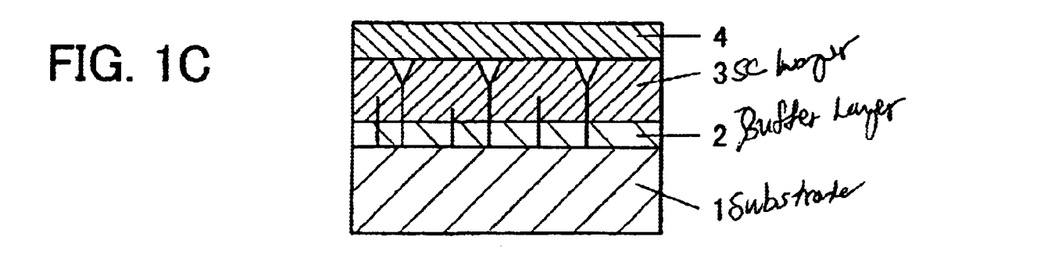
Figure 1D:
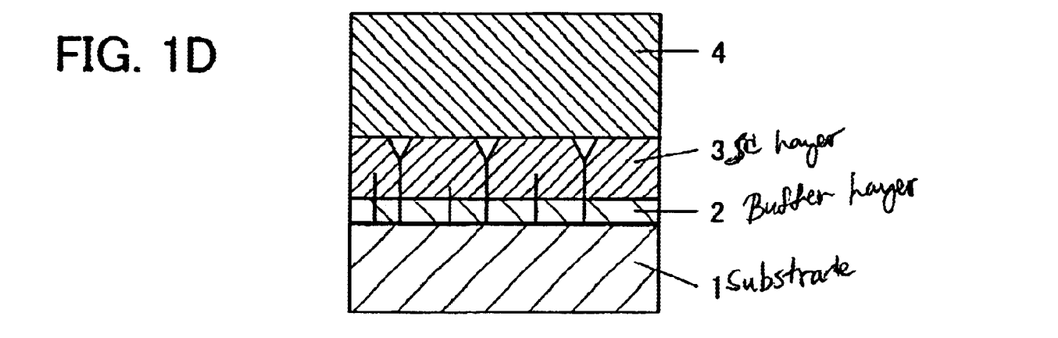
Figure 1E:
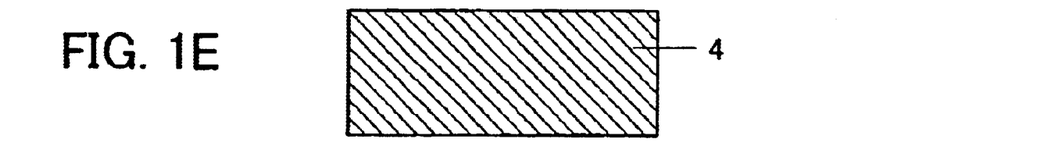

The aforementioned production process is stopped at the step shown in FIG. 1C. However, as described below, the thickness of the second Group III nitride compound semiconductor layer 4 may be increased, to thereby employ merely the layer 4 as a substrate. Specifically, epitaxial overgrowth of the second Group III nitride compound semiconductor layer 4 is carried out for a long period of time, to thereby increase the thickness of the layer 4 (see FIG. 1D). Subsequently, the substrate 1 is removed, to thereby produce a product including the buffer layer 2, the first Group III nitride compound semiconductor layer 3, and the second Group III nitride compound semiconductor layer 4. Alternatively, the substrate 1, the buffer layer 2, and the first Group III nitride compound semiconductor layer 3 are removed, to thereby produce a product consisting of the second Group III nitride compound semiconductor layer 4 (see FIG. 1E). Thus, there can be produced a Group III nitride compound semiconductor substrate which does not involve problems attributed to a difference in thermal expansion coefficient, which problems would otherwise be raised when the substrate 1 is formed of a dissimilar substrate.

FIG. 2 is a schematic representation showing an embodiment of the method for producing a Group III nitride compound semiconductor of the present invention. A buffer layer 2 and a first Group III nitride compound semiconductor layer 3 are successively formed on a substrate 10 which can be corroded by a high-temperature vapor (i.e., a gas or gas mixture containing a chemical substance capable of corroding a substrate). The first Group III nitride compound semiconductor layer 3 contains threading dislocations 101 and 102 (see FIG. 2A). The threading dislocations 102 propagate to the upper surface of the first Group III nitride compound semiconductor layer 3. Subsequently, the substrate 10 is removed through corrosion by use of a high-temperature vapor capable of corroding the substrate 10 (see FIG. 2B). Thus, there is produced a laminate including the buffer layer 2 and the first Group III nitride compound semiconductor layer 3 containing the threading dislocations 101 and 102.

Figure 2A:
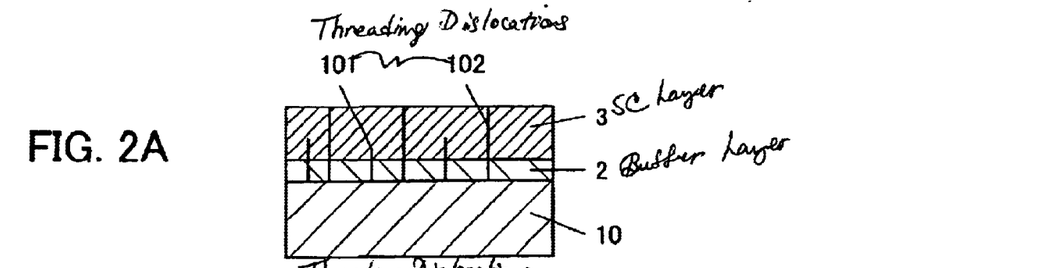
FIGS. 2A to 2F are cross-sectional views showing steps of a method for producing a Group III nitride compound semiconductor according to a second embodiment of the present invention.
Figure 2B:
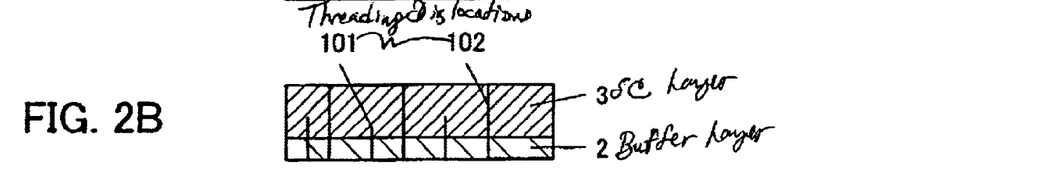
Figure 2C:
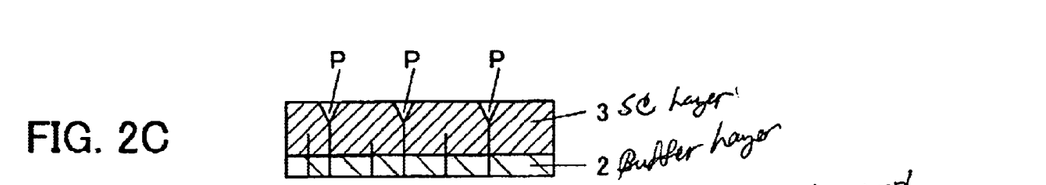

Subsequently, pits are formed under the conditions such that portions of the first Group III nitride compound semiconductor layer 3 containing lattice defects are corroded in a vapor phase faster than are portions of the semiconductor layer 3 containing no lattice defects. As a result, the threading dislocations 102 (i.e., lattice defects) which have propagated to the upper surface of the first Group III nitride compound semiconductor layer 3 are corroded easily, to thereby form pits P (see FIG. 2C).

Thereafter, a second Group III nitride compound semiconductor layer 4 is grown through vertical and lateral epitaxial overgrowth around nuclei as seeds for crystal growth which are provided on flat portions of the first Group III nitride compound semiconductor layer 3, but not on portions of the layer 3 that define the pits P. In this case, very small amounts of threading dislocations propagate from the pits P of the first Group III nitride compound semiconductor layer 3 to the second Group III nitride compound semiconductor layer 4. That is, the threading dislocations which propagate through the second Group III nitride compound semiconductor layer 4 are reduced in number as compared with the pits P of the first Group III nitride compound semiconductor layer 3, and threading dislocation density is considerably lowered (see FIG. 2D). When a semiconductor element is formed on the second Group III nitride compound semiconductor layer 4 provided on the laminate including the buffer layer 2 and the first Group III nitride compound semiconductor layer 3, the resultant element tends not to suffer-impairment caused by threading dislocations. Therefore, the method of the present invention enables provision of a Group III nitride compound semiconductor which is useful in the manufacture of Group III nitride compound semiconductor elements.

Figure 2D:
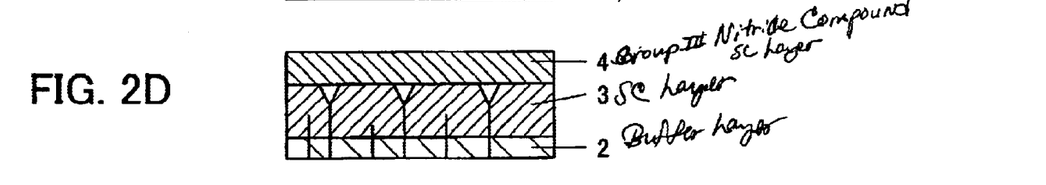
Figure 2E:
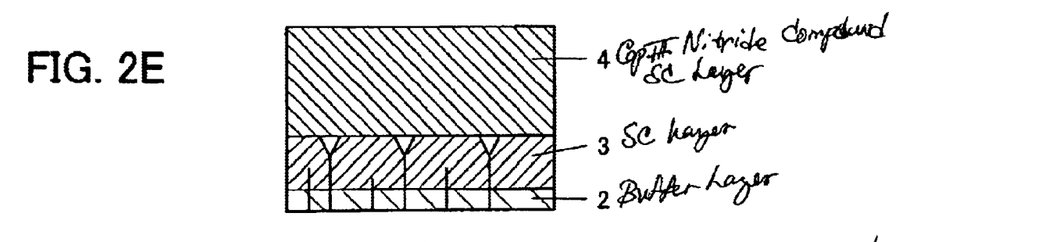
Figure 2F:
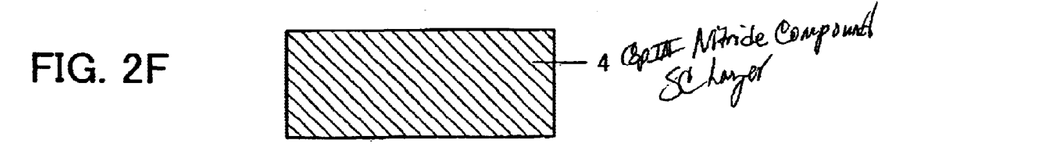

The aforementioned production process is stopped at the step shown in FIG. 2D. However, as described below, the thickness of the second Group III nitride compound semiconductor layer 4 may be increased, to thereby employ merely the layer 4 as a substrate. Specifically, epitaxial overgrowth of the second Group III nitride compound semiconductor layer 4 is carried out for a long period of time, to thereby increase the thickness of the layer 4 (see FIG. 2E). Subsequently, the buffer layer 2 and the first Group III nitride compound semiconductor layer 3 are removed, to thereby produce a product consisting of the second Group III nitride compound semiconductor layer 4 (see FIG. 2F). Thus, there can be produced a Group III nitride compound semiconductor substrate which does not involve problems attributed to the difference in thermal expansion coefficient, which problems would otherwise be raised when the substrate 10 is formed of a dissimilar substrate.

The aforementioned embodiments will next be described in more detail.

When Group III nitride compound semiconductor layers are successively formed on a substrate, the substrate may be formed from an inorganic crystal compound such as sapphire, silicon (Si), silicon carbide (SiC), spinel ($MgAl_2O_4$), ZnO, or MgO; a Group III–V compound semiconductor such as gallium phosphide or gallium arsenide; or a Group III nitride compound semiconductor such as gallium nitride (GaN).

The Group III nitride compound semiconductor layers are preferably formed through metal-organic chemical vapor deposition (MOCVD) or metal-organic vapor phase epitaxy (MOVPE), but may be formed through molecular beam epitaxy (MBE), halide vapor phase epitaxy (halide VPE), or liquid phase epitaxy (LPE). The Group III nitride compound semiconductor layers may be formed through different growth methods. Lateral growth of each of the semiconductor layers is preferably carried out through metal-organic chemical vapor deposition (MOCVD), metal-organic vapor phase epitaxy (MOVPE), or halide vapor phase epitaxy (halide VPE). Control of the growth direction of the semiconductor layer requires regulation of the ratio of the amount of a Group V element to that of a Group III element (lateral growth proceeds easily when the amount of a Group III element is reduced); reduction of the amount of a material to be fed; carrying out lateral growth under reduced pressure; and regulation of the temperature of the substrate. When the below-described p-type dopant such as Mg is added to the semiconductor layer, lateral growth of the semiconductor layer is carried out easily.

For example, when layers of a Group III nitride compound semiconductor are formed atop a sapphire substrate, in order to obtain a product of improved crystallinity, it is preferable to form a buffer layer so as to correct lattice misfit with the sapphire substrate. It is also preferable to provide a buffer layer when using a different type of substrate. As a buffer layer, a Group III nitride compound semiconductor which is formed at a low temperature such as $Al_xGa_yIn_{1-x-y}N$ ($0 \leq x \leq 1, 0 \leq y \leq 1, 0 \leq x+y \leq 1$) and more preferably $Al_xGa_{1-x}N$ ($0 \leq x \leq 1$) is used. There may be a single such buffer layer, or multiple layers having different compositions may be used. A method of forming the buffer layer may be one which forms the buffer layer at a low temperature of 380 to 420° C., or the buffer layer may be formed by MOCVD at a temperature in the range of 1,000 to 1,180° C. In addition, high purity metallic aluminum and nitrogen gas can be used as raw materials, and a buffer layer comprising AlN can be formed by reactive sputtering using a DC magnetron sputtering apparatus. In the same manner, a buffer layer expressed by the general formula $Al_xGa_yIn_{1-x-y}N$ ($0 \leq x \leq 1$, $0 \leq y \leq 1$, $0 \leq x+y \leq 1$, with the composition ratio being arbitrary) can be formed. Furthermore, it is possible to use the vapor deposition method, the ion plating method, the laser abrasion method, or the ECR method. Formation of the buffer layer by physical vapor deposition is preferably carried out at a temperature in the range of 200 to 600° C. More preferably it is carried out at a temperature in the range of 300 to 600° C. and still more preferably in the range of 350 to 450° C. When a physical vapor deposition method such as these sputtering methods is used, the thickness of the buffer layer is preferably in the range of 100 to 3,000 Angstrom. More preferably it is in the range of 100 to 400 Angstrom, and most preferably it is in the range of 100 to 300 Angstrom. Multiple layers can be formed by a method in which a layer comprising $Al_xGa_{1-x}N$ ($0 \leq x \leq 1$), for example, and a GaN layer are alternatingly formed, a method in which layers having the same composition are alternatingly formed with a forming temperature of at most 600° C. and at least 1,000° C., and the like. These methods can of course be combined with each other, and the plurality of layers may be formed by laminating three or more Group III nitride compound semiconductors of the formula $Al_xGa_yIn_{1-x-y}N$ ($0 \leq x \leq 1, 0 \leq y \leq 1, 0 \leq x+y \leq 1$). In general, a buffer sub-layer is non-crystalline, and an intermediate layer is a monocrystal. A buffer sub-layer and an intermediate layer may be formed in a single cycle, or they may be formed in plurality of cycles, and cycles may be repeated any number of times. The more repetitions the better is the crystallinity.

In the buffer layer and the upper layers formed of a Group III nitride compound semiconductor, a portion of the composition of the Group III elements can be replaced by boron (B) or thallium (Tl), and a portion of the nitrogen (N) can be replaced by phosphorus (P), arsenic (As), antimony (Sb), or bismuth (Bi). It is also possible to perform doping with these elements to an extent that the elements do not appear in the chemical compositional formula. For example, to the Group III nitride compound semiconductor $Al_xGa_{1-x}N$ ($0 \leq x \leq 1$), which does not include indium (In) or arsenic (As) in its chemical formula, by performing doping with indium (In) which has a larger atomic radius than aluminum (Al) or gallium (Ga), or with arsenic (As) which has a larger atomic radius than nitrogen (N), expansion strains of crystals due to nitrogen atoms coming out can be compensated by compressive strains, and crystallinity can be improved. In this case, acceptor impurities easily enter into the position of the Group III element, and thus a p-type crystal is obtained as grown. When crystallinity of the Group III nitride compound semiconductor is enhanced as described above, and the method of the present invention is carried out, the number of threading dislocations can be reduced to about $\frac{1}{100}$ to $\frac{1}{1,000}$. When the buffer layer and the Group III nitride compound semiconductor layer are base layers formed by at least two cycles, each Group III nitride compound semiconductor layer can be doped with an element having a larger atomic radius than the primary constituent element. When forming a light emitting element, it is generally preferable to use a binary or ternary Group III nitride compound semiconductor.

When forming an n-type Group III nitride compound semiconductor layer, a Group IV element or a Group VI element such as Si, Ge, Se, Te, or C can be added as an n-type impurity. In addition, a Group II element such as Zn, Mg, Be, Ca, Sr, or Ba or a Group IV element can be added as a p-type impurity. These can be doped in a plurality of layers, or an n-type impurity and a p-type impurity can be doped in the same layer.

When the pits are formed on the Group III nitride compound semiconductor layer by immersing the layer in a liquid, a basic solution such as a heated KOH solution is preferably employed. In the case where the pits are formed in a vapor phase, when a hydrogen halide such as HCl is employed, a Group III element and elemental nitrogen are removed in the form of a gas compound.

Examples of the method for removing the substrate through corrosion in a vapor phase include a method in which a silicon substrate is removed by use of a hydrogen halide such as HCl.

A semiconductor element such as an FET or a light-emitting element may be formed on the aforementioned Group III nitride compound semiconductor layer containing small amounts of threading dislocations. When a light-emitting element is formed, a light-emitting layer may have a multiple quantum well (MQW) structure, a single quantum well (SQW) structure, a homo junction structure, a hetero junction structure, or a double hetero junction structure. The light-emitting layer may contain a pin junction or a pn junction.

The aforementioned second Group III nitride compound semiconductor layer 4 containing small amounts of threading dislocations may be separated from the substrate 1, the buffer layer 2, and the first Group III nitride compound semiconductor 3, to thereby form a Group III nitride compound semiconductor substrate. A Group III nitride compound semiconductor element may be formed on the resultant semiconductor substrate. The substrate may be employed for forming a larger Group III nitride compound semiconductor crystal. Removal of the substrate 1, the buffer layer 2, and the semiconductor layer 3 may be carried out through any technique, such as mechanochemical polishing.

EXAMPLES

The present invention will next be described in detail by way of Examples, which should not be construed as limiting the invention thereto. The present invention provides a method for producing a Group III nitride compound semiconductor which can be applied to an arbitrary semiconductor element.

The Group III nitride compound semiconductor of the present invention was produced through metal-organic vapor phase epitaxy (hereinafter abbreviated as "MOVPE"). The following gasses were employed: ammonia ($NH_3$), a carrier gas ($H_2$ or $N_2$), trimethylgallium ($Ga(CH_3)_3$, hereinafter abbreviated as "TMG"), trimethylaluminum ($Al(CH_3)_3$, hereinafter abbreviated as "TMA"), trimethylindium ($In(CH_3)_3$, hereinafter abbreviated as "TMI"), and cyclopentadienylmagnesium ($Mg(C_5H_5)_2$, hereinafter abbreviated as "$Cp_2Mg$").

Example 1

FIG. 1 shows steps of Example 1. A monocrystalline sapphire substrate 1 containing an a-plane as a primary crystal plane was washed with an organic substance and cleaned through heat treatment. The temperature of the substrate 1 was lowered to 400° C., and $H_2$ (10 L/min), $NH_3$ (5 L/min), and TMA (20 μmol/min) were fed for about three minutes, to thereby form an AlN buffer layer 2 (thickness: about 40 nm) on the substrate 1. Subsequently, the temperature of the sapphire substrate 1 was maintained at 1,000° C., and $H_2$ (20 L/min), $NH_3$ (10 L/min), and TMG (20 μmol/min) were fed, to thereby form a GaN layer 3 (thickness: about 20 μm) (see FIG. 1A).

Subsequently, the substrate 1 was cooled to room temperature, and the surface of the GaN layer 3 was subjected to treatment by use of a KOH solution heated to about 180° C. Through this treatment, numerous pits P having a depth of some μm and having the shape of an inverted hexagonal cone were formed on the surface of the GaN layer 3 (see FIG. 1B).

Subsequently, the temperature of the sapphire substrate 1 was maintained at 1,150° C., and $H_2$ (20 L/min), $NH_3$ (10 L/min), and TMG (20 μmol/min) were fed, to thereby grow a GaN layer 4 through lateral epitaxial overgrowth around nuclei provided on flat portions of the GaN layer 3 (see FIG. 1C). Through this lateral epitaxial overgrowth, the pits P were covered by the GaN layer 4, and the surface of the GaN layer 4 became flat (see FIG. 1D). Thereafter, $H_2$ (20 L/min), $NH_3$ (10 L/min), and TMG (20 μmol/min) were fed, to thereby further grow the GaN layer 4 until the overall thickness of the GaN layer 3 and the GaN layer 4 became 30 μm. The threading dislocations contained in the GaN layer 4 were considerably reduced in number as compared with those contained in the GaN layer 3.

Example 2

In Example 2, a silicon (Si) substrate was employed. FIG. 2 shows steps of Example 2. In Example 2, a special jig was employed for subjecting either the top surface or the bottom surface of the silicon substrate to vapor-phase etching. $H_2$ (10 L/min), $NH_3$ (10 L/min), TMG (100 μmol/min), and TMA (10 μmol/min) were fed at 1,150° C., to thereby form an $Al_{0.15}Ga_{0.85}N$ buffer layer 2 (thickness: about 40 nm) on a silicon (Si) substrate 10. Subsequently, the temperature of the silicon (Si) substrate 10 was maintained at 1,000° C., and $H_2$ (20 L/min), $NH_3$ (10 L/min), and TMG (20 μmol/min) were fed, to thereby form a GaN layer 3 (thickness: about 200 μm) (see FIG. 2A).

Subsequently, HCl was fed to the bottom surface of the silicon (Si) substrate 10 on which the GaN layer 3 had not been formed, to thereby subject the silicon (Si) substrate 10 to etching and remove the substrate 10. Thus, a laminate including the buffer layer 2 and the GaN layer 3 was obtained (see FIG. 2B). Thereafter, the surface of the GaN layer 3 was subjected to treatment by use of HCl. Through this treatment, numerous pits P having a depth of some μm and having the shape of an inverted hexagonal cone were formed on the surface of the GaN layer 3 (see FIG. 2C).

Subsequently, $H_2$ (20 L/min), $NH_3$ (10 L/min), and TMG (20 μmol/min) were fed, to thereby grow a GaN layer 4 through lateral epitaxial overgrowth around nuclei provided on flat portions of the GaN layer 3 (see FIG. 2D). Through this lateral epitaxial overgrowth, the pits P were covered by the GaN layer 4, and the surface of the GaN layer 4 became flat (see FIG. 2E). Thereafter, $H_2$ (20 L/min), $NH_3$ (10 L/min), and TMG (20 μmol/min) were fed, to thereby further grow the GaN layer 4 until the overall thickness of the GaN layer 3 and the GaN layer 4 became 400 μm. The threading dislocations contained in the GaN layer 4 were considerably reduced in number as compared with those contained in the GaN layer 3.

Example 3

The GaN layer 4 formed on the GaN layer 3 in Example 2 was employed as a substrate 1. The procedure of Example 1 was repeated, except that an aluminum nitride buffer layer 2 was not employed, to thereby form a GaN layer through lateral epitaxial overgrowth on a GaN layer having pits. The threading dislocations contained in the uppermost GaN layer were reduced in number as compared with those contained in the GaN layer 4 serving as the substrate 1.

Example 4

In Example 4, the procedure of Example 1 was repeated, except that SiC was employed as a substrate 1, to thereby form a GaN layer 4 through lateral epitaxial overgrowth on a GaN layer 3 having pits P. Like the case of Example 1, the threading dislocations contained in the GaN layer 4 were reduced in number as compared with those contained in the GaN layer 3.

Example 5

In Example 5, the procedure of Example 1 was repeated, except that a sapphire substrate containing a c-plane as a primary crystal plane was employed, to thereby form a GaN layer 4 through lateral epitaxial overgrowth on a GaN layer 3 having pits P. Like the case of Example 1, the threading dislocations contained in the GaN layer 4 were reduced in number as compared with those contained in the GaN layer 3.

Example 6

In Example 6, a buffer layer including multiple layers was employed. A monocrystalline sapphire substrate 1 containing an a-plane as a primary crystal plane was washed with an organic substance and cleaned through heat treatment. The temperature of the substrate 1 was lowered to 400° C., and $H_2$ (10 L/min), $NH_3$ (5 L/min), and TMA (20 $\mu$mol/min) were fed for about three minutes, to thereby form a first AlN layer (first buffer sub-layer) 21 (thickness: about 40 nm) on the substrate 1. Subsequently, the temperature of the sapphire substrate 1 was maintained at 1,000° C., and $H_2$ (20 L/min), $NH_3$ (10 L/min), and TMG (20 $\mu$mol/min) were fed, to thereby form a GaN layer (intermediate layer) 22 (thickness: about 0.3 $\mu$m). Subsequently, the temperature of the substrate 1 was lowered to 400° C., and $H_2$ (10 L/min), $NH_3$ (5 L/min), and TMA (20 $\mu$mol/min) were fed for about three minutes, to thereby form a second AlN layer (second buffer sub-layer) 23 (thickness: about 40 nm). Subsequently, the temperature of the sapphire substrate 1 was maintained at 1,000° C., and $H_2$ (20 L/min), $NH_3$ (10 L/min), and TMG (20 $\mu$mol/min) were fed, to thereby form a GaN layer 3 (thickness: about 20 $\mu$m). Thus, there was formed a buffer layer 2 including the first AlN layer (first buffer sub-layer) 21 (thickness: about 40 nm), the GaN layer (intermediate layer) 22 (thickness: about 0.3 $\mu$m), and the second AlN layer (second buffer sub-layer) 23 (thickness: about 40 nm). In general, a buffer sub-layer is non-crystalline, and an intermediate layer is a monocrystal. A buffer sub-layer and an intermediate layer may be formed in a single cycle, or they may be formed in plurality of cycles, and cycles may be repeated any number of times. The more repetitions the better is the crystallinity.

Thereafter, pits were formed in a manner similar to that of Example 1, and a GaN layer 4 was grown through lateral epitaxial overgrowth around nuclei provided on flat portions of the GaN layer 3. The threading dislocations contained in the GaN layer 4 were considerably reduced in number as compared with those contained in the GaN layer 3.

In the process of Example 3, the method of the present invention was performed twice. Needless to say, the present invention encompasses a repeated performance of the method of the present invention. The present invention also encompasses a process including the steps of Example 1 (i.e., formation of the first GaN layer 3, formation of pits on the surface of the first GaN layer 3, and lateral growth of the second GaN layer 4), a step of forming pits on the surface of the second GaN layer 4, and a step of laterally growing a third GaN layer. No particular limitation is imposed on the times of performance of the method of the present invention. In the present invention, removal of a dissimilar substrate may be carried out in an arbitrary step.

The present invention also encompasses a process in which a first Group III nitride compound semiconductor layer is formed in advance through, for example, lateral growth so as to reduce threading dislocations; pits are formed on the surface of the first semiconductor layer; and a second Group III nitride compound semiconductor layer is formed through lateral growth. The pits do not necessarily have a uniform depth. Even when some of the pits have a very small depth, effects of the present invention as a whole are still obtained.

What is claimed is:

1. A method for producing a Group III nitride compound semiconductor comprising:

forming pits, in which a portion of an uppermost layer of a first Group III nitride compound semiconductor layer comprising one or more sub-layers, the portion including lattice defects, is subjected to treatment by use of at least one of a solution and a vapor which corrodes the portion more easily than it corrodes a portion of the uppermost layer including no lattice defects; and laterally growing a second Group III nitride compound semiconductor layer through vertical and lateral epitaxial overgrowth around nuclei as seeds for crystal growth which are on flat portions of the uppermost layer of the first Group III nitride compound semiconductor layer, but not on portions of the uppermost layer that define pits formed through said forming pits.

2. A method for producing a Group III nitride compound semiconductor according to claim 1, wherein the first Group III nitride compound semiconductor layer being accompanied by a substrate such that the semiconductor layer is formed with or without intervention of a buffer layer provided on the substrate, is subjected to treatment during said forming pits, and the substrate is removed after said laterally growing said second Group III nitride compound semiconductor layer, to thereby produce a Group III nitride compound semiconductor product having the second Group III nitride compound semiconductor layer on at least the uppermost layer of the product.

3. A method for producing a Group III nitride compound semiconductor according to claim 2, wherein said laterally growing said second Group III nitride compound semiconductor layer is carried out under conditions such that the second Group III nitride compound semiconductor layer grown through vertical and lateral epitaxial overgrowth around nuclei as seeds for crystal growth which are on flat portions of the uppermost layer of the first Group III nitride compound semiconductor layer covers the pits faster than the second Group III nitride compound semiconductor layer grows from walls which define pits formed in the uppermost layer through said forming pits.

4. A method for producing a Group III nitride compound semiconductor according to claim 3, wherein at least the uppermost layer of the first Group III nitride compound semiconductor layer comprises the same composition as the second Group III nitride compound semiconductor layer.

5. A method for producing a Group III nitride compound semiconductor according to claim 4, wherein the pits have a depth of 1 to 20 μm.

6. A method for producing a Group III nitride compound semiconductor according to claim 3, wherein the pits have a depth of 1 to 20 μm.

7. A method for producing a Group III nitride compound semiconductor according to claim 2, wherein at least the uppermost layer of the first Group III nitride compound semiconductor layer comprises the same composition as the second Group III nitride compound semiconductor layer.

8. A method for producing a Group III nitride compound semiconductor according to claim 7, wherein the pits have a depth of 1 to 20 μm.

9. A method for producing a Group III nitride compound semiconductor according to claim 2, wherein the pits have a depth of 1 to 20 μm.

10. A method for producing a Group III nitride compound semiconductor according to claim 1, wherein said laterally growing said second Group III nitride compound semiconductor layer is carried out under conditions such that the second Group III nitride compound semiconductor layer grown through vertical and lateral epitaxial overgrowth around nuclei as seeds for crystal growth which are on flat portions of the uppermost layer of the first Group III nitride compound semiconductor layer covers the pits faster than the second Group III nitride compound semiconductor layer grows from walls which define pits formed in the uppermost layer through the said forming pits.

11. A method for producing a Group III nitride compound semiconductor according to claim 10, wherein at least the uppermost layer of the first Group III nitride compound semiconductor layer comprises the same composition as the second Group III nitride compound semiconductor layer.

12. A method for producing a Group III nitride compound semiconductor according to claim 11, wherein the pits have a depth of 1 to 20 μm.

13. A method for producing a Group III nitride compound semiconductor according to claim 10, wherein the pits have a depth of 1 to 20 μm.

14. A method for producing a Group III nitride compound semiconductor according to claim 1, wherein at least the uppermost layer of the first Group III nitride compound semiconductor layer comprises the same composition as the second Group III nitride compound semiconductor layer.

15. A method for producing a Group III nitride compound semiconductor according to claim 14, herein the pits have a depth of 1 to 20 μm.

16. A method for producing a Group III nitride compound semiconductor according to claim 1, wherein the pits have a depth of 1 to 20 μm.

17. A method for producing a Group III nitride compound semiconductor comprising:

forming a first layer, comprising forming a first Group III nitride compound semiconductor layer comprising one or more sub-layers above a substrate which can be corroded by a high-temperature vapor, with or without intervention of a buffer layer;

removing the substrate through corrosion by use of a high-temperature vapor;

forming pits through vapor-phase pit formation, in which a portion of an uppermost layer of the first Group III nitride compound semiconductor layer not being accompanied by the substrate, the portion including lattice defects, is subjected to treatment by use of a vapor that corrodes the portion more easily than it corrodes a portion of the uppermost layer including no lattice defects; and laterally growing a second Group III nitride compound semiconductor layer through vertical and lateral epitaxial overgrowth around nuclei as seeds for crystal growth which are on flat portions of the uppermost layer of the first Group III nitride compound semiconductor layer, but not on portions of the uppermost layer that define pits formed through the vapor-phase pit formation.

18. A method for producing a Group III nitride compound semiconductor according to claim 17, wherein said laterally growing said second Group III nitride compound semiconductor layer carried out under conditions such that the second Group III nitride compound semiconductor layer grown through vertical and lateral epitaxial overgrowth around nuclei as seeds for crystal growth which are on flat portions of the uppermost layer of the first Group III nitride compound semiconductor layer covers the pits faster than the second Group III nitride compound semiconductor layer grows from walls which define pits formed in the uppermost layer through said forming pits.

19. A method for producing a Group III nitride compound semiconductor according to claim 18, wherein at least the uppermost layer of the first Group III nitride compound semiconductor layer comprises the same composition as the second Group III nitride compound semiconductor layer.

20. A method for producing a Group III nitride compound semiconductor according to claim 19, wherein the pits have a depth of 1 to 20 μm.

21. A method for producing a Group III nitride compound semiconductor according to claim 18, wherein the pits have a depth of 1 to 20 μm.

22. A method for producing a Group III nitride compound semiconductor according to claim 17, wherein at least the uppermost layer of the first Group III nitride compound semiconductor layer comprises the same composition as the second Group III nitride compound semiconductor layer.

23. A method for producing a Group III nitride compound semiconductor according to claim 22, wherein the pits have a depth of 1 to 20 μm.

24. A method for producing a Group III nitride compound semiconductor according to claim 17, wherein the pits have a depth of 1 to 20 μm.

* * * * *

UNITED STATES PATENT AND TRADEMARK OFFICE
CERTIFICATE OF CORRECTION

PATENT NO. : 6,860,943 B2
DATED : March 1, 2005
INVENTOR(S) : Masayoshi Koike and Hiroshi Watanabe It is certified that error appears in the above-identified patent and that said Letters Patent is hereby corrected as shown below:

The title page, showing an illustrative figure, should be deleted and substitute therefor the attached title page.

Delete Drawing Sheets 1-3 and substitute therefor the Drawing Sheets consisting of Figs. 1-3 as shown on the attached pages.

Signed and Sealed this

Twenty-ninth Day of November, 2005

JON W. DUDAS
*Director of the United States Patent and Trademark Office*

(12) United States Patent
Koike et al.

(10) Patent No.: US 6,860,943 B2
(45) Date of Patent: Mar. 1, 2005

(54) METHOD FOR PRODUCING GROUP III NITRIDE COMPOUND SEMICONDUCTOR

(75) Inventors: Masayoshi Koike, Aichi-ken (JP); Hiroshi Watanabe, Aichi-ken (JP)

(73) Assignee: Toyoda Gosei Co., Ltd., Aichi-ken (JP)

(*) Notice: Subject to any disclaimer, the term of this patent is extended or adjusted under 35 U.S.C. 154(b) by 139 days.

(21) Appl. No.: 10/268,998

(22) Filed: Oct. 11, 2002

(65) Prior Publication Data

US 2003/0070607 A1 Apr. 17, 2003

(30) Foreign Application Priority Data

Oct. 12, 2001 (JP) .................................. 2001-315955

(51) Int. Cl.$^7$ ....................... C30B 25/02; C30B 25/04; C30B 25/14
(52) U.S. Cl. ..................... 117/102; 117/89; 117/93; 117/97; 117/105; 117/108
(58) Field of Search ........................... 117/84, 89, 93, 117/97, 102, 105, 108

(56) References Cited

U.S. PATENT DOCUMENTS

| | | |
|---|---|---|
| 5,185,290 A | 2/1993 | Aoyagi et al. |
| 5,798,536 A | 8/1998 | Tsutsui |
| 6,051,849 A | 4/2000 | Davis et al. |
| 6,110,277 A | 8/2000 | Braun |
| 6,121,121 A | 9/2000 | Koide |
| 6,146,457 A | 11/2000 | Solomon |
| 6,153,010 A | 11/2000 | Kiyoku et al. |
| 6,274,518 B1 | 8/2001 | Yuri et al. |
| 6,319,742 B1 | 11/2001 | Hayashi et al. |
| 6,329,667 B1 | 12/2001 | Ota et al. |
| 6,355,497 B1 | 3/2002 | Romano et al. |
| 6,365,921 B1 | 4/2002 | Watanabe et al. |
| 6,380,108 B1 * | 4/2002 | Linthicum et al. .......... 438/791 |

FOREIGN PATENT DOCUMENTS

| | | |
|---|---|---|
| EP | 0 551 721 A2 | 7/1993 |
| EP | 0 779 666 A3 | 6/1997 |
| EP | 0 951 055 A2 | 10/1999 |
| EP | 0 993 048 A2 | 4/2000 |
| EP | 1 045 431 A1 | 10/2000 |

(List continued on next page.)

OTHER PUBLICATIONS

PCT Forms 338 and 409 (IPER) (PCT/JP02/05446) and translations thereof.
PCT Forms 338 and 409 (IPER) (PCT/JP02/02628) and translations thereof.

(List continued on next page.)

*Primary Examiner*—Felisa Hiteshew
(74) *Attorney, Agent, or Firm*—McGinn & Gibb, PLLC (57) ABSTRACT

Disclosed is a method for producing a Group III nitride compound semiconductor including a pit formation step in which a portion of an uppermost layer of a first Group III nitride compound semiconductor layer containing one or more sub-layers, the portion containing lattice defects, is subjected to treatment by use of a solution or vapor which corrodes the portion more easily than it corrodes a portion of the uppermost layer containing no lattice defects, the first Group III nitride compound semiconductor layer not being accompanied by a substrate therefor as a result of removal therefrom, or being accompanied by a substrate such that the semiconductor layer is formed with or without intervention of a buffer layer provided on the substrate; and a lateral growth step of growing a second Group III nitride compound semiconductor layer through vertical and lateral epitaxial overgrowth around nuclei as seeds for crystal growth which are on flat portions of the uppermost layer of the first Group III nitride compound semiconductor layer, but not on portions of the uppermost layer that define pits formed through the pit formation step.

24 Claims, 3 Drawing Sheets